United States Patent [19]

Suzuki

[11] Patent Number: 5,227,742

[45] Date of Patent: * Jul. 13, 1993

[54] STRIPLINE CABLE HAVING A POROUS DIELECTRIC TAPE WITH OPENINGS DISPOSED THERETHROUGH

[75] Inventor: Hirosuke Suzuki, Tokorozawa, Japan

[73] Assignee: Junkosha Co., Ltd., Tokyo, Japan

[*] Notice: The portion of the term of this patent subsequent to Dec. 17, 2002 has been disclaimed.

[21] Appl. No.: 594,279

[22] Filed: Oct. 9, 1990

Related U.S. Application Data

[63] Continuation of Ser. No. 232,754, Aug. 16, 1988, abandoned, which is a continuation of Ser. No. 504,662, Jun. 15, 1983, abandoned.

[30] Foreign Application Priority Data

Jul. 2, 1982 [JP] Japan ................. 57-100879

[51] Int. Cl.⁵ ............................................. H01P 3/08
[52] U.S. Cl. ........................................ 333/1; 333/238
[58] Field of Search ...................... 333/1, 238, 246; 174/117 F, 117 FF, 117 AS

[56] References Cited

U.S. PATENT DOCUMENTS

| | | | |
|---|---|---|---|
| 2,626,303 | 1/1953 | Link | 174/117 AS |
| 3,004,229 | 10/1961 | Stearns | 333/1 X |
| 3,179,904 | 4/1965 | Paulsen | 333/1 |
| 3,459,879 | 8/1969 | Gerpheide | 333/1 X |
| 4,382,236 | 5/1983 | Suzuki | 333/1 |
| 4,441,088 | 4/1984 | Anderson | 333/1 |
| 4,490,690 | 12/1984 | Suzuki | 333/1 |
| 4,559,254 | 12/1985 | Suzuki | 428/131 |

FOREIGN PATENT DOCUMENTS

| | | | |
|---|---|---|---|
| 158502 | 12/1981 | Japan . | |
| 143901 | 9/1982 | Japan | 333/1 |

Primary Examiner—Eugene R. LaRoche
Assistant Examiner—Benny T. Lee
Attorney, Agent, or Firm—E. Alan Uebler

[57] ABSTRACT

An improved stripline cable is provided wherein porous, expanded polytetrafluoroethylene having continuous openings therethrough is disposed between sets of substantially parallel electrical conductors and having a covering on both sides thereof holding the conductors in place. The covering is preferably of a fluororesin. Each set of conductors can be a signal conductor having a smaller cross-sectional area, i.e. small width or diameter, and a ground conductor having a larger cross-sectional area. The cable as aforesaid can also have an electromagnetic shielding material laminated to the outer sides of the covering.

6 Claims, 2 Drawing Sheets

5,227,742

STRIPLINE CABLE HAVING A POROUS DIELECTRIC TAPE WITH OPENINGS DISPOSED THERETHROUGH

CROSS-REFERENCE TO RELATED APPLICATION

This application is a continuation of prior copending application Ser. No. 07/232,754 abandoned, filed Aug. 16, 1988, which was a continuation of application Ser. No. 06/504,662, filed Jun. 15, 1983, now abandoned.

BACKGROUND OF THE INVENTION

This invention relates to a stripline cable in which a porous film of expanded polytetrafluoroethylene ("PTFE") resin having a plurality of continuous openings therethrough is disposed between electrical conductors.

Keen interest has been shown in use of polytetrafluoroethylene resin in high speed transmission lines such as stripline cables because of the advantageous features of this resin in that, when applied as a dielectric, it has a low dielectric constant and dielectric loss, and it is also stable chemically and physically. Attempts have been made to further reduce the dielectric constant of polytetrafluoroethylene resin by stretching it into a thin, porous film so that even higher performance transmission lines could be realized. However, these prior efforts to achieve the maximum performance for transmission lines have limits. My U.S. Pat. No. 4,382,236 and the references cited therein set forth the most relevant known prior art.

SUMMARY OF THE INVENTION

An improved stripline cable is provided comprising a dielectric in tape form made of a porous, crystalline polymer having a low dielectric constant approaching that of air and having at least one pair of electrical conductors, each said pair of conductors having one conductor located on one side of said tape and the other conductor located on the opposite side of said tape and in substantially parallel relationship to the first conductor of the pair, and having outer insulating layers made of suitable non-porous plastic material placed over said conductors to affix them to said dielectric tape and encapsulate the cable assembly, wherein the improvement comprises said dielectric tape having continuous openings therethrough resulting in a lower dielectric constant and a closer approach to that of air. The covering layers are preferably made of a fluororesin and have an outer electromagnetic shielding affixed thereto. Also preferred is an embodiment wherein each pair of conductors comprises a signal conductor which has a small width or diameter and a ground conductor which has a larger width or diameter than the signal conductor, the conductors of each type being arranged alternately transversely across the cable.

Figure 1:
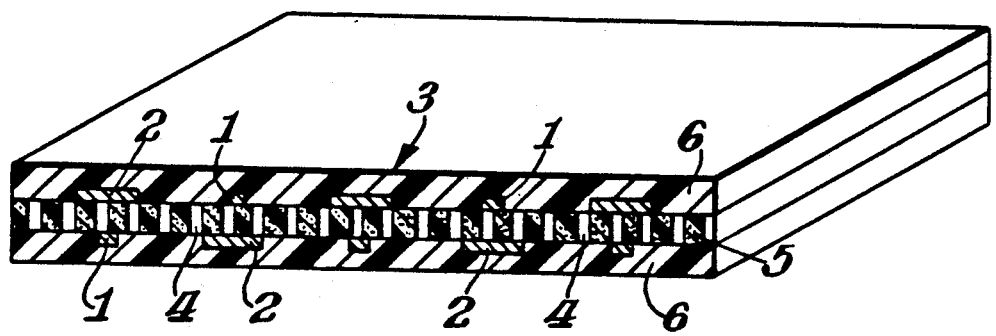
FIGS. 1 and 2 are cross-sectional views, partially schematic, of stripline cables according to different embodiments of the invention.

DETAILED DESCRIPTION OF THE INVENTION AND PREFERRED EMBODIMENTS WITH REFERENCE TO THE DRAWINGS

An improved stripline cable is provided wherein porous, expanded polytetrafluoroethylene having continuous openings therethrough is disposed between sets of substantially parallel electrical conductors and having a covering on both sides thereof holding the conductors in place. The covering is preferably of a fluororesin. Each set of conductors can be a signal conductor having a smaller cross-sectional area, i.e. small width or diameter, and a ground conductor having a larger cross-sectional area. The cable as aforesaid can also have an electromagnetic shielding material laminated to the outer sides of the covering.

According to this invention, a stripline cable is formed from sets of opposing conductors with a porous film of polytetrafluoroethylene resin provided between the opposing conductors of each set, and a covering holding these elements therein. Because porous polytetrafluoroethylene resin film having a plurality of continuous openings through the film is soft and unstable in form, the covering must be able to retain the shape of the cable and improve the stripping characteristics thereof at the cable terminals, and also be capable of providing the conductors with a high dielectric strength against external factors. Fluororesins such as polytetrafluoroethylene resin (PTFE), tetrafluoroethylene/perfluoroalkyl vinyl ether copolymer resin (PFA), tetrafluoroethylene/hexafluoropropylene copolymer resin (FEP), EPE resin, ethylene/tetrafluoroethylene copolymer resin (ETFE), trifluorochloroethylene resin, polyvinylidene difluoride resin (PVDE) and the like are suitable and preferable as the material of the outer covering because of their excellent chemical, physical, and especially thermal, stabilities.

A shield against electromagnetic signals, for example a resin film containing carbon black or metal powder as a filler, metal foil or metal gauze, may be provided as an outermost layer over the covering to provide a shielded stripline cable.

In a preferred embodiment of this invention, each set of conductors is composed of a signal conductor which has a small width or diameter and a grounded conductor which has a large width or diameter, these conductors being arranged in juxtaposition in such a manner that the conductors of each type are placed in a staggered relationship, that is, alternately with each other. This arrangement can further reduce crosstalk.

In the stripline cable according to this invention, the dielectric between the conductors made of polytetrafluoroethylene resin film having a plurality of continuous openings therethrough has a minimized dielectric constant or permittivity which is close to that of air, resulting in an appreciable reduction in the signal propagation delay in the cable compared to prior cables. This also enables a corresponding reduction of the thickness of the dielectric which leads to an increase in the cable flexibility and a decrease in crosstalk between adjacent conductors. Further, in the cable according to this invention, because the electric lines of force between the conductors converge toward the areas of high dielectric constant where there are no openings, the openings serve as electromagnetic wave leakage inhibitors, allowing still further decrease in the crosstalk between adjacent conductors. This enables a reduction in the distance between adjoining conductors, which helps to reduce the size of the cable and increase the transmission density.

The present invention is best described in detail by reference to the embodiments thereof illustrated in the accompanying drawings.

FIG. I shows a stripline cable according to one embodiment of this invention comprising pairs of conductors, each pair being a signal conductor 1 which has a small width and a ground conductor 2 which has a larger width. Both conductors can be made of silver-plated soft copper. The conductors of each type are arranged in a staggered or alternating relationship as shown. In this stripline cable, a porous polytetrafluoroethylene resin film 5 having a plurality of continuous openings 4 therethrough disposed between the pairs of conductors 1 and 2 by a method such as that disclosed in Japanese Patent Application 62946/81 "Sheet-Like Resin Material". This film 5 and both the conductors 1 and 2 are covered by a covering 6 which can be made of PTFE resin. The film 5 and covering 6 can be attached together by an adhesive or by thermal fusion. The porous polytetrafluoroethylene resin film dielectric, before the formation of the continuous openings, can be prepared by a method such as that disclosed in Japanese Patent Publication 18991/76. The resin may be sintered, partly sintered or unsintered.

This cable according to this invention, aided by the presence of the openings 4, can inhibit signal leakage between the signal conductors 1, can reduce the crosstalk between adjacent conductors significantly, can reduce the signal propagation delay, and can increase the flexibility of the cable 3.

In the flat cable 3 according to this embodiment of the invention, the crosstalk inhibition effect is further enhanced by the alternate arrangement of the grounded conductors 2, each of which is disposed in juxtaposition with its paired signal conductor 1. When a PFA resin film, a conductor and a PTFE resin film are laminated onto one side of the porous polytetrafluoroethylene resin film 5 with the plurality of openings 4, and are then integrally joined by thermal fusion, the dielectric strength between each pair of conductors is improved and also a stronger bond is provided between the resin film 5 and covering 6.

Figure 2:
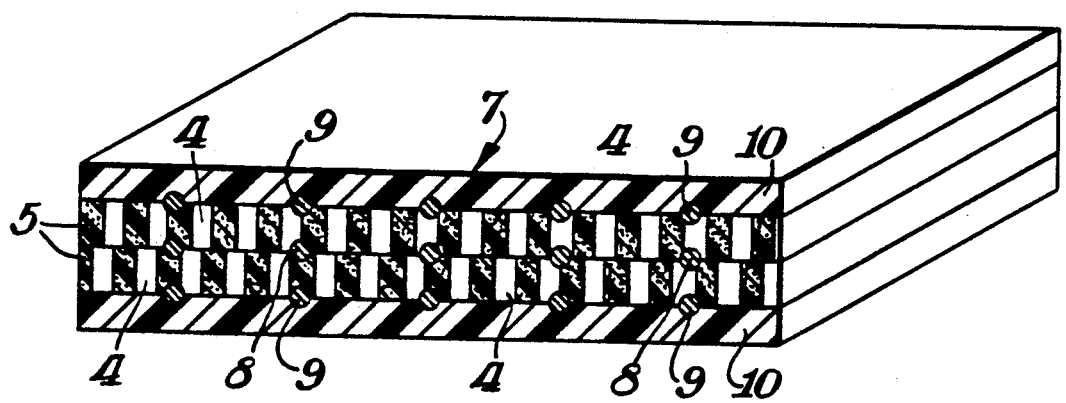

FIG. 2 shows a cross-sectional view of a stripline cable 7 according to another embodiment of this invention. In this stripline cable 7, ground conductors 9 are provided on both the upper and lower sides of each signal conductor 8 positioned between two expanded, porous polytetrafluoroethylene resin films 5 having a plurality of continuous openings 4 through each film. The ground conductors 9 on both sides and the porous polytetrafluoroethylene resin films 5 are covered by a covering 10 which can be made of PFA resin film.

In this embodiment, although the ground conductors 9 are shown equal to the signal conductors 8 in diameter, it is preferable to use ground conductors with sufficiently larger diameter than that of the signal conductors 8 to obtain a greater shielding effect.

The embodiment shown in FIG. 2 is capable of producing the same operational effects as those obtained by the embodiment of FIG. 1.

Figure 3:
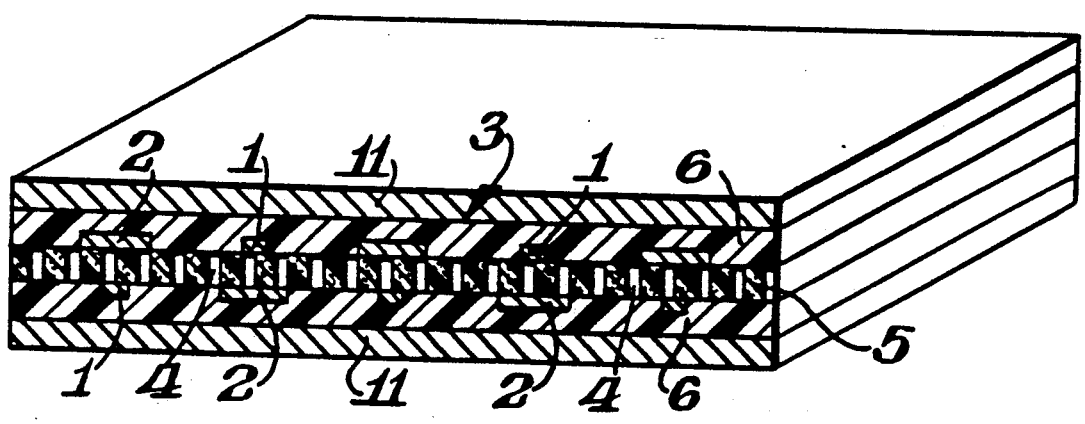
FIG. 3 illustrates the stripline cable according to the invention wherein an electromagnetic shield is provided over the outer insulating layers of the cable.

FIG. 3 shows the stripline cable 3 according to the invention wherein metallic electromagnetic shield layers 11 are provided over the outer insulating layers 6 of the cable.

As described above, this invention provides a stripline cable having excellent transmission characteristics and good flexibility by constructing the cable from sets of opposing conductors, a porous polytetrafluoroethylene resin film (or films) having a plurality of openings therethrough, and a covering holding both the conductors and film(s) together firmly.

This invention is not limited to the embodiments shown and described above, but embraces within the scope of its concept various changes and modifications, such as mixing a colorant into the resin, or rolling up the cable of the embodiment of FIG. I.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. An improved stripline cable comprising a dielectric in tape form made of a porous, crystalline polymer having two parallel sides, said cable including said dielectric tape having a low dielectric constant approaching that of air and having at least one pair of electrical conductors, each said pair of conductors having one conductor located on one side of said tape, and the other conductor located on the opposite side of said tape and in substantially parallel relationship to said one conductor of the pair, said cable further having outer insulating layers made of a suitable non-porous plastic material placed over and affixing said conductors to said dielectric tape and to encapsulate the cable assembly, said tape having length, width and thickness dimensions, wherein the improvement comprises said dielectric tape having a plurality of continuous openings extending between the two parallel sides, said openings being orthogonal to said conductors in the thickness dimension through said tape, thereby resulting in a lower dielectric constant and a closer approach to that of air.

2. The stripline cable according to claim 1 wherein said outer insulating layers are composed of a fluororesin.

3. The stripline cable according to claim 1 wherein each pair of conductors comprises said one conductor of the pair being a signal conductor which has a small cross-sectional area and the other conductor of the pair being a ground conductor which has a larger cross-sectional area than said signal conductor, the conductors of each type being arranged alternately, transversely across the width of said cable.

4. The stripline cable according to claim 1 wherein said non-porous electrical insulating layer is provided on at least one side of said dielectric in tape form.

5. The stripline cable according to claim 1 wherein an electromagnetic shield is provided over the outer insulating layers.

6. The stripline cable according to claim 1 wherein said dielectric in tape form is a porous film of polytetrafluroethylene resin.

* * * * *